United States Patent [19]

Swain

[11] Patent Number: 4,533,043
[45] Date of Patent: Aug. 6, 1985

[54] INTEGRATED CIRCUIT PACKAGE MAGAZINE AND RECEPTACLE

[75] Inventor: Thomas L. Swain, Barrington, R.I.

[73] Assignee: Monolithic Memories, Inc., Sunnyvale, Calif.

[21] Appl. No.: 482,121

[22] Filed: Apr. 5, 1983

[51] Int. Cl.³ .............................................. B65D 73/02
[52] U.S. Cl. .................................... 206/328; 206/340
[58] Field of Search ............... 206/340, 343, 328, 419, 206/422

[56] References Cited

U.S. PATENT DOCUMENTS

| | | | |
|---|---|---|---|
| 1,671,809 | 5/1928 | Briggs | 206/340 |
| 1,888,855 | 11/1932 | Fuller | 206/419 |
| 2,654,472 | 10/1953 | White | 206/422 |
| 4,172,523 | 10/1979 | Weglage | 206/343 |
| 4,353,481 | 10/1982 | Tando | 206/328 |
| 4,415,083 | 11/1983 | Kemkers | 206/334 |

FOREIGN PATENT DOCUMENTS 2030544A  4/1980  United Kingdom ................ 206/328

Primary Examiner—Joseph Man-Fu Moy
Attorney, Agent, or Firm—Thomas S. MacDonald; Alan H. MacPherson; Steven F. Caserza

[57] ABSTRACT

An integrated circuit package magazine and receptacle is provided in which one or both ends of a longitudinally elongated magazine tube (10) are cut-out to form inwardly facing spring gates (16) which have ends (18) abutting ends (22) of a series of integrated semiconductor packages (20) slidably contained on a rail surface (13) in the interior of the magazine. In its neutral inward position spring gate 16 functions to prevent egress of the semiconductor packages while allowing easy ingress of the packages by spring movement of the spring gate upwardly into a position in the same plane as the top wall (15) of the tube. The tube may take various exterior and interior configurations. Automatic release of semiconductor packages from the tube is provided by utilizing the tube in conjunction with a receptacle (30) having a longitudinal rail (34) onto which the magazine is insertable. The receptacle is of U-shaped cross-section and has an operating paw facing outwardly from the receptacle in a position to intersect and disable the spring gate (16) of the insertable magazine (10). A leaf spring (41) is provided to assist in guiding the magazine tube so that the paw engages and disables the magazine spring gate.

17 Claims, 7 Drawing Figures

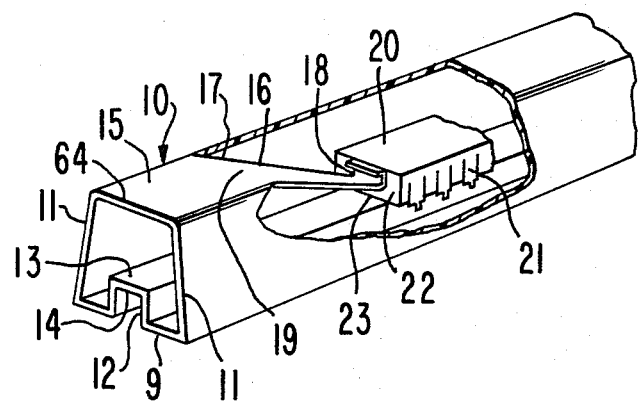

INTEGRATED CIRCUIT PACKAGE MAGAZINE AND RECEPTACLE

BACKGROUND OF THE INVENTION

1. Field of the Invention

This invention relates to magazines for holding captive and feeding electronic or electrical component packages or modules, more particularly a packaged integrated circuit assembly known as a dual-in-line-package or DIP. A DIP has two sets of spaced leads arranged in parallel rows disposed on a slight angle at the sides of a generally rectangular insulating body encapsulating the circuitry and chip of the integrated circuit.

Integrated circuit packages are required to be supported in carriers or magazines in order to protect them against damage during handling and testing, especially when handling, such as is involved in connection with routine temperature and moisture cycling procedures and the mechanized loading, feeding, sorting, marking, classification and testing, when performed by automatic mechanical handling equipment. In particular, a high degree of care is required to prevent subjecting the leads of the integrated circuit to pressures and stresses as might cause cracking of the delicate dielectric body of the integrated circuit module. It is highly desirable that manual handling and manual operations be minimized in this field both from the quality control and cost standpoint.

2. Prior Art

Elongated magazines comprising continuously-extruded plastic tubes of various length and cross-sectional configurations, generally matching the configuration of the inserted packages including the angle of the protruding rows of terminals, have been utilized for protective purposes. These are adapted to interface into various automatic machinery for performing the above feeding, sorting, marking, etc. functions. These magazines shown in U.S. Pat. Nos. 3,655,041 and 4,327,832 generally have been of an open-ended construction with the DIP's held in end-to-end relationship along the magazine or rail length.

Discrete pins or end stop plugs insertible into end apertures have been employed to prevent the DIP's from sliding out either end of the magazine when it is tilted or vibrated. Such a discrete pin or plug is seen in U.S. Pat. Nos. 4,077,557 and 4,295,258. In the latter patent and U.S. Pat. No. 4,207,665 a separate means is provided to insert or pull pins from vertical apertures contained in the magazine or shipping rail. Most pins, plugs or end wedges, however, are pulled out by a hand held claw type puller, by pliers or by an operator finger gripping or prying with a fingernail. Thumb or hand pressure is normally used to insert the pins. Pins can become lost or dropped into high tolerance machinery and their manipulation either by hand or by a puller involve time-consuming effort by an operator, lessening the production capabilities of the production or test line. It has been estimated that as much as thirty percent (30%) of operator time is spent installing and removing pins from the ends of semiconductor package magazines. Manual handling of the opening of the ends of the rail also can cause inadvertant emptying of one, or usually many more, DIPs from the magazine, with attendant damage to the DIPs from a fall to a floor or table. This problem is compounded when one wishes to feed or mount the magazine in an inclined guide on automatic machinery, wherein the DIPs are fed by gravity into a processing station such as for test or marking as shown in U.S. Pat. No. 3,701,021. A further type of closure is seen in U.S. Pat. No. 3,435,949 in which removal closures block the ends of the magazine.

SUMMARY OF THE INVENTION

This invention provides a magazine for semiconductor assemblies, particularly for DIPs, which includes an integral means for closing and opening the ends of the magazine and which, in cooperation with a fixed operating receptacle contained in the entrance of the particular processing machine, automatically opens the magazine for egress of the DIP(s) therefrom. A spring gate is provided on end surface(s) of the tube-like magazine, preferably depending from a cut-out in the top surface which forms an inwardly facing spring tongue or spring gate intersecting the magazine channel in which the DIPs are confined. A cantilevered end of the tongue or gate abuts the end of the first DIP in a line of end-to-end DIPs in the magazine and prevents their sliding egress from the tube. Insertion of the magazine into a fixed operating or tooling receptacle on the processing apparatus engages a fixed paw on the tooling member which deflects the spring gate into an outward deflected position, opening up the magazine channel and allowing egress by gravity or otherwise of the DIPs from the tube. The spring gate is so sized and positioned that in addition, it may be easily opened or deflected out of the channel by a fingernail or simple tool in the event an operator/technician wishes to manually remove one or more DIPs from the magazine.

The object of this invention is to provide a general integrated circuit package magazine with integral closure means. A further object is to provide a magazine which may be automatically opened upon insertion into a feed receptacle. An additional object of this invention is to further automate high volume handling of IC chip packages particular of the DIP design, and dispensing with hand installation and removal of magazine closures.

BRIEF DESCRIPTION OF DRAWINGS

FIG. 1 is a cut-away perspective view of an end of the improved semiconductor package magazine.

FIG. 2 is a cut-away side view of the magazine and showing semiconductor packages slidably contained therein.

FIG. 3 is an end view taken from the left side of FIG. 2.

FIG. 4 is a perspective view of a magazine receiving receptacle which automatically opens the spring gate of the improved magazine.

FIG. 5 is an end view of the receptacle of FIG. 4 taken from the right side of FIG. 4.

FIG. 6 is a cross-sectional side view of the receptacle of FIG. 4 taken on the line 6—6 of FIG. 5.

FIG. 7 is a perspective view of a discrete spring gate used in a further embodiment of the invention.

DETAILED DESCRIPTION

FIG. 1 shows a magazine 10 for use in holding, testing and shipping multiple semiconductor packages. It comprises an elongated tube of generally trapezoidal cross-section having upstanding tapered side walls 11 extending from a base 9, interior tapered side walls 12 extending radially from the base forming a flat web 14 having a top surface 13 on which the semiconductor packages are slidably placed. A generally planar horizontal wall 15 connects walls 11 extends the length of the magazine tube. The tube is normally approximately 21 inches in length but various length tubes may be employed. In a tube of such a length several dozen semiconductor packages may be held in end-to-end abutting relationship sliding on surface 13.

At one or both ends of the tube, means are provided for forming a spring gate extending downwardly and inwardly of the channel between top surface 13 on the interior "rail" formed by walls 12 and web 14. It is in this channel that the semiconductor packages 20 are slidingly contained on surface 13 so that the undersides 23 of the packages are in sliding relationship to such horizontal surface. The spring gate means is formed integrally on one or preferrably both ends of the magazine tube by a integral tab 16 cut out from the edges 17 of the tube top surface 15. The spring gate has an integral root portion 19 and a cantilevered curved end 18 which in its neutral deflected position is fixed in abutting relationship with end 22 of end-to-end abutting semiconductor packages 20 contained in the magazine. The spring gate 16 may be cut out from a metal magazine tube and then bent inwardly with sufficient stress to become plastically deformed or cut out from a plastic tube, depressed and heat set into a neutral inward position, such that the normal neutral position of the spring gate is positioned to intersect the channel between surface 13 and top 15 preventing the sliding out of packages 20 from the ends of the magazine. The orientation of the gate away from the magazine end allows for entrance of packages through the end, the inserted end of a package merely moving gate 16 upwardly where it slides on the top of the package. A rod, key, or the like can be used to push the package all the way into the confines of the magazine. A typical spring gate 16 is normally of a length of from 1 to 1½ inches long and width of ¼ inch in a tube having a half inch cross-sectional height and half inch cross-sectional width. The gate extends downwardly at an angle from the top 15 of approximately 10 to 25 degrees. Curved end 18 may extend above the top surface of package 20 so as to facilitate manual movement of the spring gate upwardly so as to remove the impediment to the sliding of a package 20 out through the end of the magazine. Basically, however, the present package is designed so as to have automatic removal of the semiconductor packages from the magazine in use.

FIG. 2 shows the preferred curvature of the end 18 of the spring gate 16 and the end-to-end abutting relationship of semiconductor package 20 and the next a semiconductor package 20a. The dual-in-line packages (DIPs) 20 and 20a which are stored and dispensed from the magazine 10 contain a series of parallel depending terminals 21 in parallel rows on either side of the package.

FIG. 3 more clearly shows the slightly angled terminals 21 extending from either side of the package 20 and the package 20 extending in the channel formed between the underside of top surface 15 and surface 13 of the interior rail.

FIG. 4 shows the receptacle of this invention which cooperates with the magazine and spring gate thereof to automatically disperse packages from the magazine. Receptacle 30 comprises an U-shaped member preferably of metal formed by legs 31, 32 upstanding from base 33. A longitudinal magazine-mounting rail 34 is fixedly mounted in a top longitudinal recess 35 in base 33. Rail 34 is bevelled at its outer and top longitudinal edges and has a series of cut-backed widths 34a, 35b in its vertical height. These cut-backs function as guideways for the inner facing surfaces of walls 12 of magazine 10.

A metal spring plate 37 is fastened by screws 38 across the top edges of legs 31 and 32. A leaf spring 41 is cut out from edges 40 of the plate 37 extending rearwardly of receptacle 30 and permanently deformed so that it depends inwardly into the passage formed by plate 37, legs 31, 32 and base 33. It has an upwardly curved cantilevered tip 42. The bottom extremity surface 41a of spring 41 is in a horizontal position parallel to base 33 and extends to a vertical plane below plate 37 a sufficient distance so that when the magazine 10 is inserted on rail 34 the end of top wall 15 of the magazine strikes the forward-facing back annular expanse of the leaf spring forcing it slightly upward and providing a downward spring holding force on the magazine top 15. This action serves to accurately and firmly position the mouth of the tube in the receptacle.

Receptacle 30 further contains spring gate deflecting means in the form of an operating paw 49 which extends from a T-section 48 of a cross bar 47 attached to the top edges of side walls 31 and 32 of the receptacle. Paw 49 and its cantilevered end 50 extends generally parallel to rail 34 and functions to initially abut the underside of spring gate 16 in the magazine when it is inserted on rail 34 so as to physically the deflect spring gate upwardly, generally back to the plane of top surface 15 of the magazine. This permits sliding ejection or gravity movement of the semiconductor packages 20 from the end of the inserted magazine 10. Paw end 50 extends forwardly of receptacle a distance beyond the surface 41a of leaf spring 41 and in a horizontal plane spaced below surface 41a. That plane is below the plane of wall surface 15 of the magazine as it is inserted into the receptacle so that paw end 50 is within the magazine channel. Paw 49 extends towards the right end of the receptacle so that its end 50 is under a substantial portion of the leaf spring 41. Leaf spring 41 is capable of spring movement upwardly when a magazine tube is placed on rail 34 and moved inwardly into the receptacle. The end of upper wall 15 of the magazine forces the leaf spring 41 upwardly and allows entrance of the cantilevered paw 50 into the top of the channel on the underside of surface 15 of the magazine and forces the cantilevered spring gate 16 of the magazine upwardly out of interference with the ends 22 of the semiconductor package 20. Paw end 50 is sufficiently high so that it does not interfere with or harm the packages 20.

A connecting bar 43 is connected across plate 37 by screws 44. Bar 43 contains a threaded aperture 45 into which a suitable screw may be placed for adjusting the spring tension on the leaf spring 41, if desired. The T-section 48 of paw support bar 47 acts as a positive stop for the end of the magazine when it is inserted into the receptacle.

FIG. 5 shows in more detail the orientation of rail 34 and the spacing of the cantilevered paw 50 and the leaf spring 41.

FIG. 6 shows more clearly the spring adjusting means 51 for adjusting the spring tension on leaf spring 41 and illustrates the position 53 where the top wall 15 of the magazine enters the space between the angular wall surface 41b of spring 41 and paw end 50.

The mounting angle and detailed design of the U-shaped receptacle and its rail 34 are generally dependent on the particular configuration of magazine 10 and the type of tooling to be applied to the process apparatus to which the magazine is to be inserted. Cantilevered paw 50 is relatively rigid with respect to leaf spring 47. The end of paw 50, as shown in FIG. 4, is generally curved so as to not damage the plastic spring gate 16 of the magazine.

The above description sets forth an integral spring gate at one of both ends of the shipping tube or rail. This present invention obviates the needs for pins or plugs and still allows the opening of the tube manually or by a suitable insertable tool which can disable the gate upwardly towards wall 15, allowing semiconductor packages free entry and exit from the tube. Primarily, in conjunction with the receptacle automatic actuation of the spring gate is provided upon insertion of the magazine into the described receptacle which is attachable to a testing or marking or other process machine or site where processing operations are being performed on the DIP. It is particularly applicable to high volume operations.

The magazine tubes 10 of the invention may be made from poly vinyl chloride or other thermoplastic in which rails are extruded and the spring gate formed by a stamping operation, formed and heat set in a downward neutral position so as to block the flow of semiconductor packages from one or both ends of the tubes. While not shown, the gates at each end of the magazine face inwardly so that the gate base portions 19 are closer to the ends of the magazine than the gate tip portions 18.

Magazine 10 may be of various cross-sectional configurations adapted to the particular cross-section of the semiconductor package being confined. Suitable reconfiguration of rail 34 and positioning of paw 49 and leaf spring 41 would be necessitated to adapt the receptacle to various magazine configurations. While being more costly, separate, nonintegral spring gates may be affixed to the magazine tube and extend inwardly into the package exit entrance channel. FIG. 7 shows a clip-mounted separate discrete gate 60 which includes a clip member 61 and a spring gate portion 62, the clip portion being mounted on the top edge of wall 15 (FIG. 1) as at 64. The top side of the clip portion may contain barbs 63 for frictionally holding the clip on the underside of wall 15. The angularly depending portion 65 of the gate 60 is deposed within and extends below a rectangular cut-out (not shown) in wall 15 inward of end portion 64 when the clip 60 is affixed to a magazine end.

It has been found that a steel paw of approximately 10 mils in thickness, and a space of 70 mils between the underside of top wall 15 and the upper wall surface of the DIP packages is sufficient to move the spring gate from its normal position abutting the end of the DIP package to a deflected position above the inserted paw. The use of the presently described invention permits automatic insertion of the semiconductor packages into the processing machine to which the magazine is to be affixed without manual insertion or removal of pins, plugs or the like.

The above description of the advantages and embodiments of this invention is intended to be illustrative only and not limiting. Other embodiments of this invention will be apparent to those skilled in the art in view of the above disclosure.

I claim:

1. A magazine for multiple semiconductor packages comprising an elongated tube having an interior cross-sectional configuration adapted to confine in sliding orientation particularly shaped semiconductor packages:

means on at least one end of said tube for partially closing said end and preventing egress of packages confined in said tube, said means comprising a spring gate attached to said tube and extending inwardly from a wall surface of said tube to intersect in its normal neutral position a front end of a semiconductor package, said package facing said at least one tube end and slidable in said tube and wherein said spring gate is attached to said wall surface adjacent an end of said tube and extends angularly into said tube and in a direction away from said tube end, said spring gate being deflectable toward said tube wall surface out of intersection with said package front end to allow egress of a package from said tube.

2. The invention of claim 1 in which said spring gate has a cantilevered end extending toward said tube wall and adapted to abut the end of a confined package.

3. The invention of claim 2 in which said cantilevered end is curved upwardly to a position below said wall but sufficiently close to the wall so as to permit manual lifting of said spring gate to a deflected position so that it no longer abuts a confined package.

4. The invention of claim 1 in which said tube includes an interior longitudinal rail portion on which DIP packages are slidably contained end-to-end, said spring gate in its neutral position contacting said rail portion to prevent egress of said DIP packages.

5. The invention of claim 1 in which a spring gate is provided at each end of said tube, each of said gates extending longitudinal of said tube toward each other.

6. The invention of claim 1 further including means for deflecting said spring gate outwardly from its position within said tube to the plane of said wall of said tube so that said spring gate may be disabled, allowing free entry and exit of semiconductor packages into said tube.

7. The invention of claim 1 in which said spring gate is a discrete clip adapted to be clipped on an end of said tube.

8. In combination, a magazine for multiple semiconductor packages comprising an elongated tube having an interior cross-sectional configuration adapted to confine in sliding orientation particularly shaped semiconductor packages;

means on at least one end of said tube for partially closing said end and preventing egress of packages confined in said tube, said means comprising a spring gate attached to said tube and extending inwardly from a wall surface of said tube to intersect in its normal neutral position an end of a semiconductor package slidable in said tube; and means cooperating with said magazine for automatically opening said spring gate, said cooperating means comprising a magazine receptacle having means for deflecting the spring gate of said magazine into a deflected position upon insertion of said magazine into said receptacle to allow opening of the end of said tube allowing egress of semiconductor package therefrom and entrance of said package to said receptacle.

9. The invention of claim 8 in which said receptacle include rail means for receiving said tube and wherein inward movement of said tube on said rail means forces said spring gate against said deflecting means and moves said spring gate out of intersecting position with the end of a confined semiconductor package.

10. The invention of claim 8 including leaf spring means extending from said receptacle above said deflecting means for guiding said magazine wall surface above said deflecting means and engaging said deflecting means with said spring gate.

11. The invention of claim 10 including means on said receptacle for adjusting the position of said leaf spring means.

12. The invention of claim 10 in which said receptacle has a U-shaped cross section and said leaf spring means is cut out from and integrally formed in a spring plate mounted across the legs of said U-shaped receptacle.

13. The invention of claim 8 in which said deflecting means is an operating paw connected to the receptacle extending toward the entrance of a receptacle channel in which the magazine is insertable.

14. The invention of claim 13 in which said receptacle has a U-shaped cross section and said paw is attached to a bridge member mounted across the legs of said U-shaped receptacle.

15. The invention of claim 14 in which said bridge member includes depending means for mounting said paw and positioned to positively stop an inserted end of said magazine preventing further inward movement into the receptacle.

16. The invention of claim 8 in which said tube has a flat upper wall extending longitudinally of the tube, said spring gate being integrally attached to said upper surface adjacent an end of said tube and extending angularly downward into said tube and in a direction away from said tube end.

17. The invention of claim 16 in which said spring gate has a cantilevered end extending upwardly toward said tube upper wall and adapted to abut the end of a confined package.

* * * * *